(12) United States Patent
Tsutsumi et al.

(10) Patent No.: US 10,388,837 B2
(45) Date of Patent: Aug. 20, 2019

(54) WHITE HEAT-CURABLE EPOXY RESIN COMPOSITION FOR OPTICAL SEMICONDUCTOR ELEMENT ENCAPSULATION AND OPTICAL SEMICONDUCTOR DEVICE USING SAME

(71) Applicant: Shin-Etsu Chemical Co., Ltd., Tokyo (JP)

(72) Inventors: Yoshihiro Tsutsumi, Annaka (JP); Tadashi Tomita, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/619,185

(22) Filed: Jun. 9, 2017

(65) Prior Publication Data
US 2017/0365756 A1 Dec. 21, 2017

(30) Foreign Application Priority Data

Jun. 20, 2016 (JP) .................. 2016-121696

(51) Int. Cl.
*H01L 33/56* (2010.01)
*C08G 59/24* (2006.01)
*C08G 59/32* (2006.01)
*C08G 59/42* (2006.01)
*C08G 59/68* (2006.01)
*C08K 3/22* (2006.01)
*C08K 3/36* (2006.01)
*C08K 5/527* (2006.01)
*C08K 7/18* (2006.01)
*C08K 9/02* (2006.01)
*H01L 33/60* (2010.01)
*C08G 59/22* (2006.01)
*C08G 59/50* (2006.01)
*C08K 3/00* (2018.01)
*C08L 63/00* (2006.01)
*C08K 3/014* (2018.01)

(52) U.S. Cl.
CPC ............ *H01L 33/56* (2013.01); *C08G 59/226* (2013.01); *C08G 59/24* (2013.01); *C08G 59/3245* (2013.01); *C08G 59/42* (2013.01); *C08G 59/4238* (2013.01); *C08G 59/5073* (2013.01); *C08G 59/686* (2013.01); *C08K 3/00* (2013.01); *C08K 3/014* (2018.01); *C08K 3/22* (2013.01); *C08K 3/36* (2013.01); *C08K 5/527* (2013.01); *C08K 7/18* (2013.01); *C08K 9/02* (2013.01); *C08L 63/00* (2013.01); *H01L 33/60* (2013.01); *C08K 2003/2241* (2013.01)

(58) Field of Classification Search
CPC ........................................................ H01L 33/56
See application file for complete search history.

(56) References Cited

U.S. PATENT DOCUMENTS

2016/0002460 A1* 1/2016 Nomura ............... C08J 5/24
                                                    524/558
2016/0161657 A1* 6/2016 Yamada .............. G02B 6/005
                                                     349/62

FOREIGN PATENT DOCUMENTS

| JP | 2006-140207 A | 6/2006 |
|----|---------------|--------|
| JP | 2008-189827 A | 8/2008 |
| JP | 2011-122116 A | 6/2011 |
| JP | 2012-172012 A | 9/2012 |
| JP | 2013-100410 A | 5/2013 |
| JP | 2013-100440 A | 5/2013 |
| JP | 2014-95051 A | 5/2014 |
| JP | 2015-101614 A | 6/2015 |
| JP | 2015-127418 A | 7/2015 |
| JP | 2015-189932 A | 11/2015 |
| WO | WO 2014/109212 A1 | 7/2014 |

OTHER PUBLICATIONS

Japanese Office Action, dated Jan. 22, 2019, for Japanese Application No. 2016-121696, with an English translation.

* cited by examiner

*Primary Examiner* — Megan McCulley
(74) *Attorney, Agent, or Firm* — Birch, Stewart, Kolasch & Birch, LLP

(57) ABSTRACT

Provided are a white heat-curable epoxy resin composition capable of yielding a cured product that is tough and superior in initial reflection rate and heat resistance; and a semiconductor device with a light receiving element and other semiconductor elements being encapsulated by such cured product. The white heat-curable epoxy resin composition contains:
- (A) a prepolymer as a molten mixture of
  - (A-1) an epoxy resin: a triazine derivative epoxy resin and/or an alicyclic epoxy compound having an epoxy group and an alicyclic structure in one molecule and being non-fluid at 25° C.,
  - (A-2) an acid anhydride having no carbon-carbon double bond and
  - (A-3) an acrylic resin-based modifier having an epoxy group and a weight-average molecular weight of 1,000 to 30,000;
- (B) a white pigment containing a titanium oxide;
- (C) an inorganic filler;
- (D) a curing accelerator; and
- (E) an antioxidant.

7 Claims, No Drawings

WHITE HEAT-CURABLE EPOXY RESIN COMPOSITION FOR OPTICAL SEMICONDUCTOR ELEMENT ENCAPSULATION AND OPTICAL SEMICONDUCTOR DEVICE USING SAME

BACKGROUND OF THE INVENTION

Field of the Invention

The present invention relates to a white heat-curable epoxy resin composition capable of yielding a cured product exhibiting a high strength, a high toughness and a superior heat resistance; and a semiconductor device with a light receiving element and other semiconductor elements being encapsulated by a cured product of such composition.

Background Art

Optical semiconductor elements such as LEDs (Light Emitting Diodes) have been used in various indicators and light sources, such as street displays, automobile lamps and residential lightings. Particularly, products employing white LEDs have been developed in an accelerated manner in various fields for the sake of carbon dioxide reduction and energy saving.

As one of the materials (e.g. LEDs) for semiconductor/electronic devices, polyphthalamide resin (PPA) as a thermoplastic resin has been widely used in light reflector materials (reflective materials). However, due to PPA's poor heat discoloration resistance and light discoloration resistance, heat-curable resins such as epoxy resins which are a typical example of heat-curable resin have been widely used instead.

JP-A-2006-140207 and JP-A-2008-189827 disclose white heat-curable epoxy resin compositions employing triazine derivative epoxy resins. JP-A-2013-100410 discloses a white heat-curable epoxy resin composition employing an alicyclic epoxy compound. The white heat-curable epoxy resin compositions disclosed in these documents are now used more often, since they have high heat resistances and high light resistances. While each of these compositions employs aromatic ring-free epoxy resins and acid anhydrides, problems that have been pointed out include that a reflector using such composition will exhibit an insufficient strength and toughness or even break due to the fact that packages have been miniaturized in recent years in terms of productivity (number of products taken per unit area), and that reflector portions have thus become extremely thin.

In order to solve these problems, there have been reported epoxy resin compositions for use in optical semiconductors, such as those employing acid anhydrides modified by a linker and those employing acid anhydrides having flexibility (JP-A-2013-100440 and JP-A-2014-095051). However, there has been a problem that since the skeleton of an acid anhydride having a modified portion and the skeleton of a flexible acid anhydride themselves have low heat resistances, the reliability of such epoxy resin composition for use in an optical semiconductor will be impaired when subjected to heat and light. That is, none of the conventional epoxy resin compositions for use in optical semiconductors has yet been able to meet all the requirements of strength, toughness and heat resistance.

Further, there have also been reported compositions employing a reinforcing fibrous inorganic filler and a reinforcing whisker-type inorganic filler in combination, instead of employing epoxy resins or acid anhydrides (JP-A-2012-172012 and JP-A-2015-189932).

However, these compositions have exhibited major problems such as discoloration and a significant decrease in formability due to the impurities derived from the inorganic fillers. In this sense, not all problems have yet been resolved.

SUMMARY OF THE INVENTION

Therefore, it is an object of the present invention to provide a white heat-curable epoxy resin composition capable of yielding a cured product that is tough and superior in initial reflection rate and heat resistance; and a semiconductor device with a light receiving element and other semiconductor elements being encapsulated by such cured product.

The inventors of the present invention conducted a series of studies to solve the above problems, and completed the invention through a finding that the following white heat-curable epoxy resin composition was able to achieve the aforementioned objects.

That is, the present invention is to provide the following white heat-curable epoxy resin composition; and a semiconductor device with a light receiving element and other semiconductor elements being encapsulated by a cured product of such composition.

[1]
A white heat-curable epoxy resin composition comprising:
(A) a prepolymer as a molten mixture of
(A-1) an epoxy resin: a triazine derivative epoxy resin and/or an alicyclic epoxy compound having an epoxy group and an alicyclic structure in one molecule and being non-fluid at 25° C.,
(A-2) an acid anhydride having no carbon-carbon double bond and
(A-3) an acrylic resin-based modifier having an epoxy group and a weight-average molecular weight of 1,000 to 30,000, wherein
a ratio of [equivalent of epoxy groups in (A-1) and (A-3)]/[equivalent of acid anhydride groups in (A-2)] is 0.6 to 2.0, and an amount of the component (A-3) added is 2 to 30 parts by mass per a total of 100 parts by mass of the components (A-1) and (A-2);
(B) a white pigment containing a titanium oxide by an amount of not smaller than 10% by mass, the white pigment being in an amount of 3 to 350 parts by mass per the total of 100 parts by mass of the components (A-1) and (A-2);
(C) an inorganic filler in an amount of 80 to 600 parts by mass per the total of 100 parts by mass of the components (A-1) and (A-2);
(D) a curing accelerator in an amount of 0.05 to 5 parts by mass per the total of 100 parts by mass of the components (A-1) and (A-2); and
(E) an antioxidant in an amount of 0.1 to 12 parts by mass per the total of 100 parts by mass of the components (A-1) and (A-2).

[2]
The white heat-curable epoxy resin composition according to [1], wherein the titanium oxide in the component (B) is surface-treated.

[3]
The white heat-curable epoxy resin composition according to [2], wherein the titanium oxide is surface-treated with at least one treating agent selected from silica, alumina, zirconia, polyol and an organic silicon compound.

[4]
The white heat-curable epoxy resin composition according to any one of [1] to [3], wherein the triazine derivative epoxy resin of the component (A-1) is 1,3,5-triazine derivative epoxy resin.

[5]
The white heat-curable epoxy resin composition according to any one of [1] to [3], wherein the alicyclic epoxy compound of the component (A-1) that has an epoxy group and an alicyclic structure in one molecule and is non-fluid at 25° C., is represented by the following general formula (1):

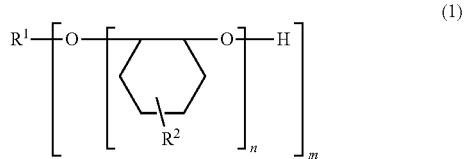

wherein $R^1$ represents an m-valent saturated hydrocarbon group obtained by eliminating m hydrogen atom or atoms from a saturated hydrocarbon having 1 to 30 carbon atoms; m represents an integer of 1 to 30; n represents an integer of 1 to 100; and $R^2$ independently represents a hydrogen atom or a group selected from a saturated hydrocarbon group having 1 to 30 carbon atoms, an unsaturated hydrocarbon group having 2 to 30 carbon atoms, an epoxy group, and a saturated hydrocarbon group having 3 to 30 carbon atoms and an epoxy group, provided that at least one $R^2$ represents an epoxy group or a saturated hydrocarbon group having an epoxy group.

[6]
An optical semiconductor element case having a cured product of the white heat-curable epoxy resin composition as set forth in any one of [1] to [3].

[7]
An optical semiconductor device comprising the optical semiconductor element case as set forth in [6].

According to the present invention, there can be provided a white heat-curable epoxy resin composition capable of yielding a cured product that is tough and superior in initial reflection rate and heat resistance; and a semiconductor device with a light receiving element and other semiconductor elements being encapsulated by a cured product of such composition.

DETAILED DESCRIPTION OF THE INVENTION

The present invention is described in greater detail hereunder.
Heat-Curable Epoxy Resin Composition for Optical Semiconductor Element Encapsulation
(A) Prepolymer
A prepolymer as a component (A) is obtained by melting and mixing an epoxy resin (A-1), an acid anhydride (A-2) and an acrylic resin-based modifier (A-3).

The epoxy resin (A-1) refers to a triazine derivative epoxy resin and/or an alicyclic epoxy compound having an epoxy group(s) and an alicyclic structure(s) in one molecule and being non-fluid at 25° C. The acid anhydride (A-2) is an acid anhydride having no carbon-carbon double bond. The acrylic resin-based modifier (A-3) has an epoxy group(s) and a weight-average molecular weight of 1,000 to 30,000.

Here, the components (A-1), (A-2) and (A-3) are melted and mixed together with a ratio of [equivalent of epoxy groups in (A-1) and (A-3)]/[equivalent of acid anhydride groups in (A-2)] being 0.6 to 2.0; and an added amount of the component (A-3) being 2 to 30 parts by mass per a total of 100 parts by mass of the components (A-1) and (A-2).
(A-1) Epoxy Resin
(A-1-1) Triazine Derivative Epoxy Resin A triazine derivative epoxy resin as a component (A-1-1) of the invention, when melted and mixed with the components (A-2) and (A-3), is able to restrict yellowing of a cured product of a heat-curable epoxy resin composition. Thus, the component (A-1-1) is added to obtain a resin cured product exhibiting a small degree of deterioration with time.

One preferable example of such triazine derivative epoxy resin is 1,3,5-triazine nucleus derivative epoxy resin. Particularly, 1,3,5-triazine nucleus derivative epoxy resin having an isocyanurate ring(s) is superior in light resistance and electrical insulation. More particularly, preferred is a type of 1,3,5-triazine nucleus derivative epoxy resin having a divalent or even a trivalent epoxy group(s) per one isocyanurate ring. Specific examples of the triazine derivative epoxy resin include tris (2,3-epoxypropyl) isocyanurate and tris (α-methylglycidyl) isocyanurate.

It is preferred that the triazine derivative epoxy resin used in the invention have a softening point of 40 to 125° C. In the present invention, a triazine derivative epoxy resin does not include those having a hydrogenated triazine ring(s).

(A-1-2) Alicyclic Epoxy Compound Having Epoxy Group and Alicyclic Structure in One Molecule and being Non-Fluid at 25° C.

As is the case with the triazine derivative epoxy resin (A-1-1), an alicyclic epoxy compound (A-1-2) of the invention, when melted and mixed with the components (A-2) and (A-3), is able to restrict yellowing of the cured product of the heat-curable epoxy resin composition. Thus, the alicyclic epoxy compound (A-1-2) is added to obtain a resin cured product exhibiting a small degree of deterioration with time.

Such alicyclic epoxy compound is an epoxy resin having an alicyclic structure(s) and an epoxy group(s). Specifically, there exist at least one epoxy group and at least one alicyclic structure, in one molecule. Here, in the case of an epoxy group where a condensed ring has been formed by a cycloalkyl group and an oxirane ring, such as 3,4-epoxycyclohexyl group, it is considered that there exist one epoxy group and one alicyclic structure respectively. Further, the alicyclic epoxy compound may also be an epoxy resin having a structure where one or some epoxy groups are bonded to an alicyclic structure(s) through single bonds or divalent organic groups such as an alkylene group.

While there are no particular restrictions on the alicyclic epoxy compound (A-1-2), examples thereof include a hydrogenated bisphenol A-type epoxy compound, a cyclohexene oxide-type epoxy compound, norbornene oxide-type epoxy compound, an adamantane skeleton-containing epoxy compound and an alcohol-added epoxy compound. Specific examples of the alicyclic epoxy compound (A-1-2) include 3,4,3',4'-diepoxybicyclohexyl, 1,2-epoxy-4-(2-oxiranyl) cyclohexane, and adducts of these diepoxides and polyalcohols; 2,4-di[2-(3-{oxabicyclo[4.1.0]heptyl})ethyl]-2,4,6,6,8,8-hexamethyl-cyclotetrasiloxane; 4,8-di[2-(3-{oxabicyclo[4.1.0]heptyl})ethyl]-2,2,4,6,6,8-hexamethyl-cyclotetrasiloxane; 2,4-di[2-(3-{oxabicyclo[4.1.0]heptyl})ethyl]-6,8-dipropyl-2,4,6,8-tetramethyl-cyclotetrasiloxane; 4,8-di[2-(3-{oxabicyclo[4.1.0]heptyl})ethyl]-2,6-dipropyl-2,4,6,8-tetramethyl-cyclotetrasiloxane; 2,4,8-tri[2-(3-{oxabicyclo[4.1.0]heptyl})ethyl]-2,4,6,6,8-pentamethyl-cyclotetrasiloxane; 2,4,8-tri[2-(3-{oxabicyclo[4.1.0]heptyl})ethyl]-6-propyl-2,4,6,8-tetramethyl-cyclotetrasiloxane; 2,4,6,8-tetra[2-(3-{oxabicyclo[4.1.0]heptyl})ethyl]-2,4,6,8-tetramethyl-cyclotetrasiloxane; a cyclic polysiloxane compound having at least two epoxy groups in one molecule, such as silsesquioxane having an epoxy group(s); and hydrogenated bisphenol-type epoxy compounds represented by the following formulae (1) and (2). Here, 1,2-epoxy-4-(2-oxiranyl) cyclohexane; 3',4'-epoxycyclohexylmethyl (3,4-epoxy) cyclohexanecarboxylate; and the hydrogenated bisphenol-type epoxy compound represented by the following formula (1) are preferred. Particularly preferred is the hydrogenated bisphenol-type epoxy compound represented by the following formula (1).

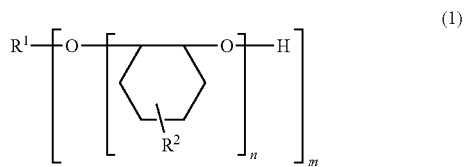
(1)

In the above formula (1), $R^1$ represents an m-valent saturated hydrocarbon group obtained by eliminating m hydrogen atoms from a saturated hydrocarbon having 1 to 30 carbon atoms. It is preferred that the saturated hydrocarbon represented by $R^1$ have 1 to 10 carbon atoms, more preferably 2 to 7 carbon atoms. m represents an integer of 1 to 30, preferably 1 to 10, or even more preferably 1 to 6. However, m is not greater than the number of the carbon atoms of the group represented by $R^1$. n represents an integer of 1 to 100, preferably 1 to 30. $R^2$ independently represents a hydrogen atom or a group selected from a saturated hydrocarbon group having 1 to 30 carbon atoms; an unsaturated hydrocarbon group having 2 to 30 carbon atoms; an epoxy group; and a saturated hydrocarbon group having 3 to 30 carbon atoms and an epoxy group(s). Here, at least one $R^2$ represents an epoxy group or a saturated hydrocarbon group having an epoxy group(s).

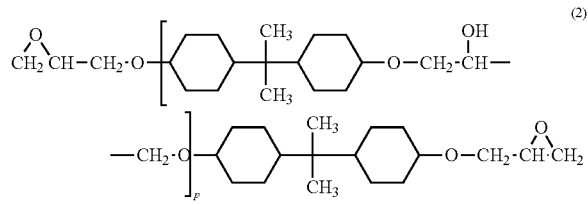
(2)

In the above formula (2), p represents an integer of 1 to 100.

It is preferred that the alicyclic epoxy compound used in the invention be in a solid state at 25° C. in terms of burr restriction and ease in handling. Further, one kind of such alicyclic epoxy compound may be used singularly, or two or more kinds of it may be used in combination.

(A-2) Acid Anhydride

The acid anhydride as the component (A-2) of the invention functions as a curing agent, and is that having no carbon-carbon double bond for the purpose of imparting a light resistance to the heat-curable epoxy resin composition. Such purpose may also be achieved by not having an aromatic-ring(s). Specific examples of the acid anhydride include hexahydrophthalic anhydride, methylhexahydrophthalic anhydride, trialkyltetrahydrophthalic anhydride and hydrogenated methylnadic anhydride, among which hexahydrophthalic anhydride and/or methylhexahydrophthalic anhydride are preferred. Any one of these acid anhydride-based curing agents may be used singularly, or two or more of them may be used in combination.

(A-3) Acrylic Resin-Based Modifier Having Epoxy Group and Weight-Average Molecular Weight of 1,000 to 30,000

As a flexibility-imparting agent, the acrylic resin-based modifier having an epoxy group(s) and the weight-average molecular weight of 1,000 to 30,000 is added to the white heat-curable epoxy resin composition of the invention, for the purpose of improving strength at room temperature and a crack resistance. One kind of such acrylic resin-based modifier may be used singularly, or two or more kinds of it may be used in combination.

The acrylic resin-based modifier as the component (A-3) of the invention is capable of expressing the abovementioned modification effects as it becomes well dispersed and then incorporated into the system, as a result of being simultaneously melted and mixed with the epoxy resin (A-1) and the acid anhydride (A-2) at the time of performing prepolymerization beforehand.

Examples of the epoxy group-containing acrylic resin-based modifier as the component (A-3) of the invention, include an acrylic polymer, an acrylic/styrene polymer, an acrylic/other vinyl polymer and an acrylic/styrene/other vinyl polymer, each of which has an epoxy resin(s). These polymers can be obtained by polymerizing an epoxy group-containing acrylic monomer; polymerizing a monomer mixture having an epoxy group-containing acrylic monomer and a styrene monomer; polymerizing a monomer mixture having an epoxy group-containing acrylic monomer and an other vinyl monomer; or polymerizing a monomer mixture having an epoxy group-containing acrylic monomer, a styrene monomer and an other vinyl monomer.

Examples of the epoxy group-containing acrylic monomer include (meth)acrylate glycidyl; (meth)acrylate ester having a cyclohexene oxide structure; and (meth)acrylic glycidyl ether. A preferable example of the epoxy group-containing acrylic monomer is (meth)acrylate glycidyl which is highly reactive.

Examples of the styrene monomer include styrene and α-methylstyrene, among which styrene is preferred.

Examples of the other vinyl monomer include alkyl group-containing alkyl (meth)acrylate ester having 1 to 22 carbon atoms, such as methyl (meth)acrylate, ethyl (meth)acrylate, propyl (meth)acrylate, butyl (meth)acrylate, 2-ethylhexyl (meth)acrylate, cyclohexyl (meth)acrylate and stearyl (meth)acrylate; polyalkyleneglycol (meth) acrylate ester; alkoxyalkyl (meth)acrylate ester such as methoxyethyl (meth)acrylate; hydroxyalkyl (meth)acrylate ester; dialkylaminoalkyl (meth)acrylate ester; benzyl (meth)acrylate ester; phenoxyalkyl (meth)acrylate ester; isobornyl (meth) acrylate ester; and alkoxysilylalkyl (meth)acrylate ester. Further, as a vinyl monomer, there may also be used (meth)acrylic amide; (meth)acrylic dialkylamide; vinyl esters such as vinyl acetate; vinyl ethers; aromatic vinyl monomers of (meth) allyl ethers; and α-olefin monomers such as ethylene and propylene. Any one of these vinyl monomers may be used singularly, or two or more of them may be used in combination.

The weight-average molecular weight of the acrylic resin-based modifier as the component (A-3) may just be 1,000 to 30,000. Although there are no particular restrictions on such weight-average molecular weight, it is preferred that the weight-average molecular weight be 1,500 to 20,000, more preferably 2,000 to 15,000. When this weight-average molecular weight is smaller than 1,000, the strength and crack resistance of the cured product of the heat-curable epoxy resin composition may not be improved. Meanwhile, when this weight-average molecular weight is larger than 30,000, a compatibility of the acrylic resin-based modifier to the epoxy resin may be significantly impaired. Particularly, the weight-average molecular weight of the component (A-3) refers to a weight-average molecular weight measured in terms of standard polystyrene by gel permeation chromatography (GPS).

It is preferred that the average number of the epoxy groups per one molecule of the acrylic resin-based modifier as the component (A-3) be 3 to 30, more preferably 3.5 to 20, or even more preferably 4.0 to 10. When this average number of the epoxy groups is below 3, it may be difficult for the acrylic resin-based modifier to be blended into the system in a way such that there may not be achieved a cured product exhibiting a desired strength and crack resistance. Meanwhile, when this average number of the epoxy groups is greater than 30, there may occur a problem in formability as the curability of the heat-curable epoxy resin composition becomes excessively high.

The acrylic resin-based modifier as the component (A-3) may be produced by any method such as polymerization performed using a continuous stirring tank, bulk polymerization, solution polymerization and emulsion polymerization. Among these methods, preferred is performing polymerization using a continuous stirring tank, and more preferred is performing polymerization in a continuous stirring tank at a high temperature. It is preferred that a polymerization temperature at the time of production be 130 to 350° C., more preferably 150 to 330° C. When the polymerization temperature is within the range, a polymer with a target molecular weight can be efficiently obtained either without using a radical polymerization initiator and/or a chain transfer agent at all, or with an extremely small amount of such initiator and/or agent. When the polymerization temperature is lower than 130° C., a large amount of a radical polymerization initiator and/or a chain transfer agent is required to obtain a polymer with a target molecular weight, which will then make it easy for impurities to be contained in the polymer obtained. Meanwhile, when the polymerization temperature is greater than 350° C., the polymer will be thermally decomposed in a way such that the target polymer may not be able to be obtained.

Further, as the acrylic resin-based modifier (A-3), there can be used commercially available products such as ARUFON UG-4010, ARUFON UG-4040 (by TOAGOSEI CO., LTD.).

The acrylic resin-based modifier as the component (A-3) is added in an amount of 2 to 30 parts by mass, particularly preferably 2.5 to 15 parts by mass, per a total of the components (A-1) and (A-2). When the amount of the component (A-3) is smaller than 2 parts by mass, there cannot be obtained a cured product having the desired strength and crack resistance. When the amount of the component (A-3) is larger than 30 parts by mass, the heat resistance and light resistance of the cured product may be impaired, the epoxy resin composition may not be cured in a stable manner at the time of molding, and/or the glass-transition temperature of the cured product may become extremely low.

In addition, a ratio of (molar number of all epoxy groups)/(molar number of acid anhydride), as a compounding ratio of the epoxy resin (A-1) and the epoxy group-containing acrylic resin-based modifier (A-3) to the acid anhydride (A-2), is 0.6 to 2.0, preferably 0.8 to 2.0, more preferably 1.0 to 1.8. When this compounding ratio is lower than 0.6, an uncured curing agent may remain the cured product in a way such that the moisture resistance of the cured product obtained may be impaired. Further, when this compounding ratio is higher than 2.0, the heat-curable epoxy resin composition may exhibit curing failures in a way such that the reliability of the cured product obtained may be impaired.

Other than the prepolymer solely composed the epoxy resin (A-1), the acid anhydride (A-2) and the acrylic resin-based modifier (A-3), the prepolymer as the component (A) may also be a resin component which is a solid product (i.e. prepolymer) obtained by combining the epoxy resin (A-1), the acrylic resin-based modifier (A-3) and the acid anhydride (A-2) at a molar ratio of [epoxy groups in (A-1) and (A-3)]/[acid anhydride groups in (A-2)] of 0.6 to 2.0, and then reacting the same under the presence of a later-described antioxidant (E) and/or curing accelerator (D).

At that time, it is preferred that such solid product be crushed, for example, and then used in the form of a fine powder. It is preferred that the average particle diameter of such fine powder be 5 μm to 3 mm, particularly preferably 20 μm to 2 mm. When the average particle diameter is within the range, the components (D) and/or (E) which are added to the solid product by a small amount can be easily dispersed in the epoxy resin composition in a homogenous manner. Particularly, the average particle diameter refers to a cumulative mass average value $D_{50}$ (or median diameter) obtained through particle size distribution measurement using a laser diffraction method.

When synthesizing the prepolymer as the component (A), a given amount or less of an epoxy resin other than the component (A-1) may be used in combination if necessary, as long as the effects of the invention will not be impaired. Examples of such epoxy resin include a bisphenol A-type epoxy resin; a bisphenol F-type epoxy resin; a biphenol-type epoxy resin such as 3,3',5,5'-tetramethyl-4,4'-biphenol-type epoxy resin or a 4,4'-biphenol-type epoxy resin; a phenol novolac-type epoxy resin; a cresol novolac-type epoxy resin; a bisphenol A novolac-type epoxy resin; a naphthalenediol-type epoxy resin; a trisphenylol methane-type epoxy resin; a tetrakisphenylol ethane-type epoxy resin; a phenol dicyclopentadiene novolac-type epoxy resin; and a silicone-modified epoxy resin. In view of these epoxy resins' resistances to heat and ultraviolet rays, desired are a bisphenol A-type epoxy resin, a bisphenol F-type epoxy resin and a silicone-modified epoxy resin. Further, it is preferred that the other epoxy resins have a softening point of 50 to 100° C. in terms of ease in prepolymerization and handling.

The abovementioned prepolymer is obtained by melting and mixing the components (A-1), (A-2) and (A-3) at a temperature of 60 to 120° C., preferably 70 to 110° C., for a period of 4 to 20 hours, preferably 6 to 15 hours. Here, the antioxidant as the component (E) may also be added thereto in advance. However, simply performing homogenous mixing by a mixer or the like will result in an insufficiently dispersed acrylic resin-based modifier, which will then lead to burrs, and thus make it difficult to achieve desired effects.

Further, the abovementioned prepolymer may be produced by previously melting and mixing the components (A-1), (A-2) and (A-3) and the curing accelerator as the component (D) at 30 to 80° C., preferably 40 to 70° C., for a period of 2 to 12 hours, preferably 3 to 8 hours. Here, the component (E) may also be added thereto in advance.

In this way, there is obtained the prepolymer as the solid product having a softening point of 40 to 100° C., preferably 45 to 70° C. When adding such prepolymer to the epoxy resin composition of the invention, it is preferred that the prepolymer be turned into a fine powder beforehand through crushing or the like. When the softening point of the prepolymer is lower than 40° C., the prepolymer cannot be obtained as a solid. When the softening point of the prepolymer is higher than 100° C., there may be exhibited an extremely low fluidity required at the time of forming the epoxy resin composition.

It is preferred that the component (A) be contained in the composition of the invention by an amount of 10 to 45% by mass, more preferably 12 to 40% by mass, or even more preferably 15 to 35% by mass.

(B) White Pigment

For the use of a reflector (reflective plate) or the like of an optical semiconductor device, a white pigment containing titanium oxide at the least is added to the white heat-curable epoxy resin composition of the invention for the purpose of improving a degree of whiteness.

Here, the white pigment is defined as such that exhibits a reflection rate of not lower than 80% at a wavelength of 450 nm with 5% by mass of the prepolymer as the component (A) added. Those exhibiting a reflection rate of lower than 80% are regarded as an inorganic filler as a component (C). Examples of such white pigment include: typical examples of rare-earth oxides which are titanium oxide and yttrium oxide; zinc sulfate; zinc oxide; and magnesium oxide. Titanium oxide is invariably added to further improve the degree of whiteness of the white pigment. Titanium oxide may be either used singularly, or used in combination with an other white pigment(s). It is preferred that titanium oxide be contained in the white pigment as the component (B) by an amount of not smaller than 10% by mass, particularly preferably not smaller than 13% by mass.

Although the unit lattice of the titanium oxide used as the white pigment (B) may be any of the rutile type, the anatase type or the brookite type, preferred is the rutile type. Further, while there are no restrictions on the average particle diameter and shape of the titanium oxide, it is preferred that the average particle diameter of the titanium oxide be 0.05 to 3.0 µm, more preferably not larger than 1.0 µm, or even more preferably not larger than 0.40 µm. Particularly, the average particle diameter refers to a cumulative mass average value $D_{50}$ (or median diameter) obtained through particle size distribution measurement using a laser diffraction method.

Further, although a titanium oxide produced by any of a sulfuric acid method, a chlorine method and the like may be used, it is preferred that the titanium oxide be produced by a chlorine method in terms of degree of whiteness.

In order to improve a compatibility to and a dispersibility in resin and an other inorganic filler, it is preferred that the titanium oxide be surface-treated with at least one treating agent selected from silica, alumina, zirconia, polyol and an organic silicon compound. That is, in order to improve the dispersibility of the titanium oxide, it is preferred that the titanium oxide be surface-treated beforehand by, for example, a hydrous oxide such as alumina, silica and/or zirconia. In order to improve a wettability and compatibility to the epoxy resin, it is preferred that the titanium oxide be treated with polyol. Further, in order to improve a fluidity of the composition and an initial reflection rate of the cured product obtained from the white heat-curable epoxy resin, it is preferred that the titanium oxide be treated with an organic silicon compound. Examples of such organic silicon compound include monomeric organic silicon compounds such as chlorosilanes, silazanes and silane coupling agents having reactive functional groups (e.g. epoxy groups, amino groups); and organopolysiloxanes such as silicone oils and silicone resins. Further, there may also be used an other treating agent normally used to surface-treat titanium oxide, such as an organic acid (e.g. stearic acid). The titanium oxide may be surface-treated with a treating agent other than those described above, or by more than one treating agent.

The white pigment is added in an amount of 3 to 350 parts by mass, particularly preferably 5 to 300 parts by mass, per the total of 100 parts by mass of the components (A-1) and (A-2). When the white pigment is added in an amount of smaller than 3 parts by mass, there may not be achieved a sufficient degree of whiteness. Further, when the white pigment is added in an amount of larger than 350 parts by mass, not only the proportion of other components that are added to improve the mechanical strength of the cured product will become smaller, but the formability of the epoxy resin composition may be significantly impaired as well. Here, it is preferred that the white pigment as the component (B) be contained in the entire white heat-curable epoxy resin composition by an amount of 1 to 50% by mass, 3 to 40% by mass.

(C) Inorganic Filler

An inorganic filler other than the component (B) is added to the white heat-curable epoxy resin composition of the invention, as the component (C). Those that are normally added to an epoxy resin composition may be used as such inorganic filler. While specific examples of the inorganic filler include silicas such as a molten silica and a crystalline silica; alumina; silicon nitride; aluminum nitride; boron nitride; antimony trioxide; glass fibers; and potassium titanate, the white pigment (white coloring agent) as the component (B) is excluded. Although there are no particular restrictions on the average particle diameters and shapes of these inorganic fillers, it is preferred that the average particle diameter be larger than 3 µm, but not larger than 50 µm. Here, the average particle diameter refers to a cumulative mass average value $D_{50}$ (or median diameter) obtained through particle size distribution measurement using a laser diffraction method.

As the component (C), preferred are silica-based inorganic fillers such as a crushed silica and a molten spherical silica. A molten spherical silica is preferable in terms of formability and fluidity. While there are no particular restrictions on the average particle diameter of a silica-based inorganic filler, it is preferred that the average particle diameter be 4 to 40 µm, particularly preferably 7 to 35 µm. Further, in order to achieve a high fluidity, it is preferred that there be used in combination those having a fine particle size of 0.1 to 3 µm, those having a middle particle size of 4 to 8 µm and those having a large particle size of 10 to 50 µm.

The inorganic filler as the component (C) may also be surface-treated beforehand by a coupling agent such as a silane coupling agent and a titanate coupling agent, for the purpose of strengthening the inorganic filler's bond to the prepolymer as the component (A) and the white pigment as the component (B), and achieving a high fluidity by lowering the viscosity of the epoxy resin composition at the time of molding.

Preferable examples of such coupling agent include γ-glycidoxypropyltrimethoxysilane; γ-glycidoxypropylmethyldiethoxysilane; an epoxy functional alkoxysilane such as β-(3,4-epoxycyclohexyl)ethyltrimethoxysilane; and a mercapto functional alkoxysilane such as γ-mercaptopropyltrimethoxysilane. However, those causing the treated filler to easily discolor with time (e.g. amine-based silane coupling agent) are not preferable. Here, there are no particular restrictions on the added amount of the coupling agent used to perform surface treatment and a surface treatment method. Surface treatment may thus be performed in accordance with an ordinary method.

The inorganic filler as the component (C) is added in an amount of 80 to 600 parts by mass, preferably 200 to 500 parts by mass, per the total of 100 parts by mass of the components (A-1) and (A-2). When the inorganic filler is added in an amount of smaller than 80 parts by mass, a sufficient strength may not be achieved, burrs may easily occur at the time of molding, and the cured product may easily exhibit warpage due to an excessively large difference in thermal expansion coefficient between a lead frame and the cured product. Meanwhile, when the inorganic filler is added in an amount of larger than 600 parts by mass, the viscosity of the epoxy resin composition will increase in a way such that filling failures and loss in flexibility will occur. At that time, the stress on the cured product of the epoxy resin composition will thus become so significant that failures such as peeling from the lead frame may occur. Here, it is preferred that the inorganic filler as the component (C) be contained in the entire white heat-curable epoxy resin composition by an amount of 10 to 90% by mass, 20 to 80% by mass.

(D) Curing Accelerator

The curing accelerator as the component (D) is added as an essential component to accelerate the curing of the epoxy resin in the component (A). While there are no particular restrictions on such curing accelerator, there may be used any known curing accelerators as curing catalysts for epoxy resin compositions. Examples of such curing accelerators include tertiary amines, imidazoles, and organic carboxylates and organic metal carboxylates thereof; metal-organic chelate compounds; aromatic sulfonium salt; and phosphorous curing catalysts such as organic phosphine compounds and phosphonium compounds, and salts of these phosphorous curing catalysts. One or more of these curing accelerators may be used, and imidazoles, phosphorous curing catalysts and tertiary amines are preferred among the above examples. Specifically, preferred are, for example, 2-ethyl-4-methylimidazole, methyltributylphosphonium dimethylphosphate and octylates of tertiary amines. Further, it is also preferable to use quaternary phosphonium bromide and an organic acid salt of amine in combination.

The curing accelerator is used in an amount of 0.05 to 5 parts by mass, particularly preferably 0.1 to 2 parts by mass, per the total of 100 parts by mass of the components (A-1) and (A-2). When the curing accelerator is used in an amount outside of the range, the cured product of the epoxy resin composition may exhibit a worsened balance between heat resistance and moisture resistance, and the epoxy resin composition may be cured extremely quickly or slowly at the time of molding.

(E) Antioxidant

The antioxidant (E) as an essential component is added to the white heat-curable epoxy resin composition of the invention for the purpose of improving the initial reflection rate and maintaining a reflection rate for a long period of time. As such antioxidant (E), there may be used a phenolic antioxidant, a phosphorous antioxidant or a sulfur-based antioxidant. Specific examples of these antioxidants are listed below.

Examples of the phenolic antioxidant include 2,6-di-t-butyl-p-cresol; butylated hydroxyanisole; 2,6-di-t-butyl-p-ethylphenol; stearyl-β-(3,5-di-t-butyl-4-hydroxyphenyl) propionate; 2,2'-methylenebis (4-methyl-6-t-butylphenol); 4,4'-butylidenebis (3-methyl-6-t-butylphenol); 3,9-bis[1,1-dimethyl-2-{β-(3-t-butyl-4-hydroxy-5-methylphenyl)propionyloxy}ethyl]2,4,8,10-tetraoxaspiro[5,5]undecane; 1,1,3-tris (2-methyl-4-hydroxy-5-t-butylphenyl) butane; and 1,3,5-trimethyl-2,4,6-tris (3,5-di-t-butyl-4-hydroxybenzyl) benzene.

Examples of the phosphorous antioxidant include triphenyl phosphite; diphenylalkyl phosphite; phenyldialkyl phosphite; tri (nonylphenyl) phosphite; trilauryl phosphite; trioctadecyl phosphite; tris (2,4-di-tert-butylphenyl) phosphite; distearyl pentaerythritol diphosphite; diisodecyl pentaerythritol diphosphite; di (2,4-di-tert-butylphenyl) pentaerythritol diphosphite; tristearyl sorbitol triphosphite; and tetrakis (2,4-di-tert-butylphenyl)-4,4'-biphenyl diphosphonate.

Examples of the sulfur-based antioxidant include dilauryl thiodipropionate, distearyl thiodipropionate and dibenzyl disulfide.

Any one of the aforementioned antioxidants may be used singularly, or two or more of them may be used in combination. The antioxidant(s) are added in an amount of 0.1 to 12 parts by mass, preferably 0.5 to 10 parts by mass, per the total of 100 parts by mass of the components (A-1) and (A-2). When the antioxidant(s) are in an extremely small amount, the cured product may not exhibit a sufficient heat resistance and may discolor. Further, when the antioxidant(s) are in an extremely large amount, the cured product may not exhibit a sufficient curability and strength due to a curing inhibition of the epoxy resin composition, and the cured product may also discolor due to an excessively high heat value observed at the time of curing the epoxy resin composition.

In addition to the components (A) to (E), the following components may be further added to the composition of the invention.

(F) Mold Release Agent

A mold release agent may be added to the white heat-curable epoxy resin composition of the invention. The mold release agent as a component (F) is added to improve a mold releasability at the time of molding.

The mold release agent may, for example, be a natural wax such as carnauba wax; or a synthetic wax such as an acid wax, polyethylene wax and fatty acid ester. Many of these mold release agents are usually susceptible to yellowing and deterioration with time under a high temperature and light irradiation. Therefore, as a mold release agent, preferred are an glycerin derivative and fatty acid ester which will only discolor at a low level; and carnauba wax which is colored in the beginning, but will only discolor at a low level with time.

The mold release agent as the component (F) is added in an amount of 0.05 to 12.0% by mass, particularly preferably 0.1 to 8.0% by mass, with respect to the total amount of the component (A). When the mold release agent is added in an amount of smaller than 0.05% by mass, the cured product of the epoxy resin composition may not exhibit a sufficient mold releasability. When the mold release agent is added in an amount of larger than 12.0% by mass, there may occur, for example, bleeding failures and adhesion failures.

(G) Coupling Agent

A coupling agent such as a silane coupling agent and a titanate coupling agent may be added to the white heat-curable epoxy resin composition of the invention for the purpose of improving the bonding strength between the resin and the inorganic filler; and an adhesion strength between the resin and a metal as a substrate. Examples of such coupling agent include γ-glycidoxypropyltrimethoxysilane; γ-glycidoxypropylmethyldiethoxysilane; an epoxy functional alkoxysilane such as β-(3,4-epoxycyclohexyl)ethyltrimethoxysilane; and a mercapto functional alkoxysilane such as γ-mercaptopropyltrimethoxysilane. Here, those causing the resin to discolor when left under a temperature of not lower than 150° C. are not preferred as is the case with an amine-based silane coupling agent. While there are no particular restrictions on a surface treatment method using the coupling agent, surface treatment may be performed in accordance with an ordinary method.

It is preferred that the coupling agent as the component (G) be added in an amount of 0.1 to 8.0% by mass, particularly preferably 0.5 to 6.0% by mass, with respect to the total amount of the component (A). When the coupling agent is added in an amount of smaller than 0.1% by mass, there may be achieved an insufficient adhesion effect of the epoxy resin composition to a base material. Further, when the coupling agent is added in an amount of larger than 8.0% by mass, the viscosity of the epoxy resin composition may become extremely low in a way such that voids may occur in the cured product.

Other Additives

Various kinds of additives may be further added to the white heat-curable epoxy resin composition of the invention if necessary. For example, in order to improve the properties of the resin, additives such as a silicone powder, a silicone oil, a thermoplastic resin, a thermoplastic elastomer, an organic synthetic rubber and an ion trapping agent may be added to the composition without impairing the effects of the present invention.

One example of a production method of the white heat-curable epoxy composition of the invention is as follows. That is, the epoxy resin, white pigment, inorganic filler, curing catalyst, antioxidant and other additives are at first combined together at given ratios, followed by thoroughly and homogenously mixing the same using a mixer or the like, and then melting and mixing a mixture thus obtained using a heated roll mill, a kneader, an extruder or the like. Next, a product thus prepared is cooled and solidified, and then crushed into an appropriate size so as to obtain a molding material of the heat-curable epoxy resin composition. There, in view of the ease in handling, the epoxy resin is turned into a solid product through prepolymerization before use.

As the most common molding method for forming a light reflector from the white heat-curable epoxy resin composition of the invention, there may be employed, for example, a transfer molding method or a compression molding method. The transfer molding method is performed using a transfer molding machine under a molding pressure of 5 to 20 N/mm$^2$. Particularly, the transfer molding method is performed at a molding temperature of 120 to 190° C. for a molding time of 30 to 500 sec, preferably at a molding temperature of 150 to 185° C. for a molding time of 30 to 180 sec. Further, the compression molding method is performed using a compression molding machine at a molding temperature of 120 to 190° C. for a molding time of 30 to 600 sec, preferably at a molding temperature of 130 to 160° C. for a molding time of 120 to 300 sec. In each method, post curing may be further performed at 150 to 185° C. for 0.5 to 20 hours.

The heat-curable epoxy resin composition of the invention can also be used as a normal encapsulation material for semiconductor, and used to encapsulate, for example, various kinds of modules for automobile use. In such cases, carbon black or the like is used as a coloring agent. Although any commercially available carbon black may be employed, desired is a high-purity carbon black containing a small amount of alkali metals and halogens.

WORKING EXAMPLE

The present invention is described in detail hereunder with reference to working and comparative examples. However, the invention is not limited to the working examples described below.

Raw materials used in working and comparative examples are as follows.

(A-1) Epoxy resin
  (A-1-1): tris (2,3-epoxypropyl) isocyanurate (TEPIC-s by Nissan Chemical Industries, Ltd.)
  (A-1-2): 1,2-epoxy-4-(2-oxiranyl) cyclohexane adduct of 2,2-bis (hydroxymethyl)-1-butanol (EHPE-3150 by Daicel Corporation)
(A-2) Acid anhydride
  (A-2-1): Methylhexahydrophthalic anhydride (RIKACID MH by New Japan Chemical Co., Ltd.)
  (A-2-2): 1,2,3,6-tetrahydrophthalic anhydride (RIKACID TH by New Japan Chemical Co., Ltd.)
(A-3) Acrylic resin-based modifier
  (A-3-1): Epoxy group-containing acrylic modifier (molecular weight 2,900; ARUFON UG-4010 by TOAGOSEI CO., LTD.)
  (A-3-2): Epoxy group-containing styrene/acrylic modifier (molecular weight 11,000; ARUFON UG-4040 by TOAGOSEI CO., LTD.)
(A-4) Other flexibility-imparting agent (for use in comparative example)
  (A-4-1): Polycarbonate polyol (PLACCEL CD205PL by Daicel Corporation)
  (A-4-2): Polycaprolactone polyol (PLACCEL 305 by Daicel Corporation)
(B) White pigment
  (B-1): Alumina-treated titanium dioxide with an average particle diameter of 0.21 μm (CR-60 by ISHIHARA SANGYO KAISHA, LTD.)
(C) Inorganic filler
  (C-1): Spherical molten silica with an average particle diameter of 10 μm (by TATSUMORI LTD.)
(D) Curing accelerator
  (D-1): 1-benzyl-2-phenylimidazole (1B2PZ by SHIKOKU CHEMICALS CORPORATION)
(E) Antioxidant
  (E-1): Phosphite-based antioxidant (PEP-8: by ADEKA CORPORATION)
(F) Mold release agent
  (F-1) Carnauba wax (TOWAX-131 by TOA KASEI CO., LTD.)
(G) Coupling agent
  Silane coupling agent: 3-mercaptopropyltrimethoxysilane (KBM-803 by Shin-Etsu Chemical Co., Ltd.)

Synthesis Example 1: Epoxy Resin Prepolymer (Production of Component (A))

The prepolymer as the component (A) was synthesized by combining the raw material components (A-1) to (A-4) at the ratios shown in Table 1 and Table 2, and then heating, melting and mixing them under the reaction conditions shown in Table 1 and Table 2.

Table 1

TABLE 2

| Composition (part by mass) | | | Prepolymer A | Prepolymer B | Prepolymer C | Prepolymer D | Prepolymer E | Prepolymer F |
|---|---|---|---|---|---|---|---|---|
| (A-1) | TEPIC-s | A-1-1 | 43.6 | 43.6 | 43.6 | 43.6 | | |
| | EHPE-3150 | A-1-2 | | | | | 58.2 | 58.2 |
| (A-2) | RIKACID MH | A-2-1 | 56.4 | 56.4 | 56.4 | 56.4 | 41.8 | 41.8 |
| | RIKACID TH | A-2-2 | | | | | | |
| (A-3) | UG-4010 | A-3-1 | 5.0 | 10.0 | | | 5.0 | |
| | UG-4040 | A-3-2 | | | 5.0 | 10.0 | | 5.0 |
| (A-4) | Other flexibility-imparting agent | A-4-1 | | | | | | |
| | | A-4-2 | | | | | | |

TABLE 2-continued

| | | | | | | | | |
|---|---|---|---|---|---|---|---|---|
| Epoxy group equivalent/acid anhydride group equivalent | | | 1.3 | 1.3 | 1.3 | 1.3 | 1.3 | 1.3 |
| Reaction condition | | | 80° C., 8 hours | 80° C., 8 hours | 80° C., 8 hours | 80° C., 8 hours | 80° C., 4 hours | 80° C., 4 hours |
| Composition (part by mass) | | | Prepolymer G | Prepolymer H | Prepolymer I | Prepolymer J | Prepolymer K | Prepolymer L |
| (A-1) | TEPIC-s | A-1-1 | 43.6 | | 45.8 | | 43.6 | 43.6 |
| | EHPE-3150 | A-1-2 | | 58.2 | | 60.3 | | |
| (A-2) | RIKACID MH | A-2-1 | 56.4 | 41.8 | | | 56.4 | 56.4 |
| | RIKACID TH | A-2-2 | | | 54.2 | 39.7 | | |
| (A-3) | UG-4010 | A-3-1 | | | 5.0 | 5.0 | | |
| | UG-4040 | A-3-2 | | | | | | |
| (A-4) | Other flexibility-imparting agent | A-4-1 | | | | | 5.0 | |
| | | A-4-2 | | | | | | 5.0 |
| Epoxy group equivalent/acid anhydride group equivalent | | | 1.3 | 1.3 | 1.3 | 1.3 | 1.3 | 1.3 |
| Reaction condition | | | 80° C., 8 hours | 80° C., 4 hours | 80° C., 8 hours | 80° C., 4 hours | 80° C., 8 hours | 80° C., 8 hours |

Working Examples 1 to 6; Comparative Examples 1 to 8

The various components were combined together at the compounding ratios (parts by mass) shown in Table 3 and Table 4, followed by melting and mixing the same using a heated twin roll mill. In working examples 1 to 6; and comparative examples 1 to 6, the heat-curable epoxy resin composition was obtained by cooling and then crushing the mixture that had been prepared. However, in comparative examples 7 and 8, the heat-curable epoxy resin composition obtained was either in the form of a paste or semisolid. The following properties of each composition were then measured, and the results thereof are shown in Table 3 and Table 4.

Spiral Flow Value

A spiral flow value of each composition was measured using a mold manufactured in accordance with EMMI standard, and under conditions of molding temperature 175° C./molding pressure 6.9 N/mm²/molding time 90 sec.

Bending Strength, Bending Elastic Modulus and Amount of Deflection at Room Temperature Molding was performed using a mold manufactured in accordance with JIS-K6911 standard, and under the conditions of molding temperature 175° C./molding pressure 6.9 N/mm²/molding time 90 sec, followed by performing post curing at 175° C. for an hour. A bending strength, bending elastic modulus and amount of deflection of each post-cured specimen were then measured at room temperature (25° C.).

Glass-Transition Temperature (Tg)

A specimen of a size of 15×5×5 mm was prepared by performing molding under the conditions of molding temperature 175° C./molding pressure 6.9 N/mm²/molding time 90 sec. The specimen was then subjected to post curing at 175° C. for an hour. A glass-transition temperature of the post-cured specimen was measured by TMA (TMA 8310 by Rigaku Corporation).

Light Reflection Rate (Initial Light Reflection Rate, Light Reflection Rate after Long-Term Heat Resistance Test A disk-type cured product having a diameter of 50 mm and a thickness of 3 mm was prepared by performing molding under the conditions of molding temperature 175° C./molding pressure 6.9 N/mm²/molding time 90 sec. The disk-type cured product was then subjected to secondary curing at 175° C. for an hour. X-rite 8200 (by S.D.G K.K.) was later used to measure an initial light reflection rate of the secondarily cured product at a wavelength of 450 nm. The secondarily cured product was further subjected to a heat treatment at 180° C. for 168 hours, followed by using X-rite 8200 (by S.D.G K.K.) to measure a light reflection rate thereof at the wavelength of 450 nm in a similar fashion.

TABLE 3

| | | | | Working example | | | | | |
|---|---|---|---|---|---|---|---|---|---|
| Composition (part by mass) | | | | 1 | 2 | 3 | 4 | 5 | 6 |
| (A) | Prepolymer | Prepolymer A | | 105.0 | | | | | |
| | | Prepolymer B | | | 110.0 | | | | |
| | | Prepolymer C | | | | 105.0 | | | |
| | | Prepolymer D | | | | | 110.0 | | |
| | | Prepolymer E | | | | | | 105.0 | |
| | | Prepolymer F | | | | | | | 105.0 |
| (B) | White pigment | B-1 | | 100.0 | 100.0 | 100.0 | 100.0 | 100.0 | 100.0 |
| (C) | Inorganic filler | C-1 | | 400.0 | 400.0 | 400.0 | 400.0 | 400.0 | 400.0 |
| (D) | Curing accelerator | D-1 | | 0.5 | 0.5 | 0.5 | 0.5 | 0.5 | 0.5 |
| (E) | Antioxidant | E-1 | | 2.5 | 2.5 | 2.5 | 2.5 | 2.5 | 2.5 |
| (F) | Mold release agent | F-1 | | 1.5 | 1.5 | 1.5 | 1.5 | 1.5 | 1.5 |
| (G) | Coupling agent | G-1 | | 0.5 | 0.5 | 0.5 | 0.5 | 0.5 | 0.5 |
| Evaluation | Spiral flow value | | inch | 36 | 38 | 30 | 28 | 28 | 28 |
| | Room temperature bending strength | | MPa | 105 | 129 | 100 | 119 | 100 | 119 |
| | Room temperature bending elastic modulus | | MPa | 16400 | 16500 | 16800 | 16800 | 17800 | 17800 |
| | Deflection amount | | mm | 1.10 | 1.23 | 1.15 | 1.29 | 1.03 | 1.13 |
| | Glass-transition temperature | | ° C. | 165 | 162 | 165 | 160 | 152 | 152 |
| | Reflection rate | Initial | % | 95 | 95 | 95 | 94 | 94 | 94 |
| | | 180° C. 168 hours | % | 70 | 67 | 68 | 67 | 62 | 62 |

TABLE 4

| Composition (part by mass) | | | Comparative example 1 | 2 | 3 | 4 | 5 |
|---|---|---|---|---|---|---|---|
| (A) | Prepolymer | Prepolymer G | 100.0 | | | | |
| | | Prepolymer H | | 100.0 | | | |
| | | Prepolymer I | | | 105.0 | | |
| | | Prepolymer J | | | | 105.0 | |
| | | Prepolymer K | | | | | 105.0 |
| | | Prepolymer L | | | | | |
| (A-1) | Epoxy resin | A-1-1 | | | | | |
| (A-2) | Acid anhydride curing agent | A-2-1 | | | | | |
| (A-3) | Acrylic resin-based modifier | A-3-1 | | | | | |
| (B) | White pigment | B-1 | 100.0 | 100.0 | 100.0 | 100.0 | 100.0 |
| (C) | Inorganic filler | C-1 | 400.0 | 400.0 | 400.0 | 400.0 | 400.0 |
| (D) | Curing accelerator | D-1 | 0.5 | 0.5 | 0.5 | 0.5 | 0.5 |
| (E) | Antioxidant | E-1 | 2.5 | 2.5 | 2.5 | 2.5 | 2.5 |
| (F) | Mold release agent | F-1 | 1.5 | 1.5 | 1.5 | 1.5 | 1.5 |
| (G) | Coupling agent | G-1 | 0.5 | 0.5 | 0.5 | 0.5 | 0.5 |
| Evaluation | Spiral flow value | inch | 35 | 45 | 28 | 30 | 36 |
| | Room temperature bending strength | MPa | 85 | 80 | 100 | 85 | 105 |
| | Room temperature bending elastic modulus | MPa | 16500 | 18000 | 17000 | 17000 | 15000 |
| | Deflection amount | mm | 1.00 | 0.85 | 1.02 | 1.00 | 1.09 |
| | Glass-transition temperature | °C. | 168 | 180 | 168 | 180 | 140 |
| | Reflection rate   Initial | % | 94 | 95 | 92 | 90 | 92 |
| |          180° C. 168 hours | % | 63 | 60 | 50 | 42 | 51 |

| Composition (part by mass) | | | Comparative example 6 | 7 | 8 |
|---|---|---|---|---|---|
| (A) | Prepolymer | Prepolymer G | | | |
| | | Prepolymer H | | | |
| | | Prepolymer I | | | |
| | | Prepolymer J | | | |
| | | Prepolymer K | | | |
| | | Prepolymer L | 105.0 | | |
| (A-1) | Epoxy resin | A-1-1 | | 43.6 | 43.6 |
| (A-2) | Acid anhydride curing agent | A-2-1 | | 56.4 | 56.4 |
| (A-3) | Acrylic resin-based modifier | A-3-1 | | | 5.0 |
| (B) | White pigment | B-1 | 100.0 | 100.0 | 100.0 |
| (C) | Inorganic filler | C-1 | 400.0 | 400.0 | 400.0 |
| (D) | Curing accelerator | D-1 | 0.5 | 0.5 | 0.5 |
| (E) | Antioxidant | E-1 | 2.5 | 2.5 | 2.5 |
| (F) | Mold release agent | F-1 | 1.5 | 1.5 | 1.5 |
| (G) | Coupling agent | G-1 | 0.5 | 0.5 | 0.5 |
| Evaluation | Spiral flow value | inch | 44 | 78 | 80 |
| | Room temperature bending strength | MPa | 90 | 42 | 38 |
| | Room temperature bending elastic modulus | MPa | 17400 | 14800 | 15800 |
| | Deflection amount | mm | 0.99 | 0.51 | 0.42 |
| | Glass-transition temperature | °C. | 159 | 160 | 160 |
| | Reflection rate   Initial | % | 91 | 95 | 93 |
| |          180° C. 168 hours | % | 48 | 63 | 63 |

According to Table 3 and Table 4, it was confirmed that the white heat-curable epoxy resin composition containing the acrylic resin-based modifier by the amount within the range of the present invention could provide a cured product exhibiting an improved strength, an improved amount of deflection and a high toughness. Further, unlike other flexibility-imparting agents, there were not observed significant decreases in the glass-transition temperature and the reflection rate in a long-term heat resistance test, even when an acrylic block copolymer was added. Furthermore, according to the results of comparative examples 7 and 8, it is obvious that when the components (A-1) to (A-3) were not prepolymerized, it was difficult for the composition to solidify, and the dispersibility of each component was poor as well. Thus, it was confirmed that a semiconductor device was effective when an LED reflector thereof was encapsulated by the cured product of the white heat-curable epoxy resin composition of the invention.

What is claimed is:

1. A white heat-curable epoxy resin composition comprising:

(A) a prepolymer as a reaction product of a molten mixture of
  (A-1) an epoxy resin: a triazine derivative epoxy resin and/or an alicyclic epoxy compound having an epoxy group and an alicyclic structure in one molecule and being non-fluid at 25° C.,
  (A-2) an acid anhydride having no carbon-carbon double bond and
  (A-3) an acrylic resin-based modifier having an epoxy group and a weight-average molecular weight of 1,000 to 30,000, wherein
a ratio of (equivalent of epoxy groups in (A-1) and (A-3))/(equivalent of acid anhydride groups in (A-2)) is 0.6 to 2.0, and an amount of the component (A-3) added is 2 to 30 parts by mass per a total of 100 parts by mass of the components (A-1) and (A-2);
(B) a white pigment containing a titanium oxide by an amount of not smaller than 10% by mass, the white pigment being in an amount of 3 to 350 parts by mass per the total of 100 parts by mass of the components (A-1) and (A-2);

(C) an inorganic filler in an amount of 80 to 600 parts by mass per the total of 100 parts by mass of the components (A-1) and (A-2);

(D) a curing accelerator in an amount of 0.05 to 5 parts by mass per the total of 100 parts by mass of the components (A-1) and (A-2); and (E) an antioxidant in an amount of 0.1 to 12 parts by mass per the total of 100 parts by mass of the components (A-1) and (A-2).

2. The white heat-curable epoxy resin composition according to claim 1, wherein the titanium oxide in the component (B) is surface-treated.

3. The white heat-curable epoxy resin composition according to claim 2, wherein the titanium oxide is surface-treated with at least one treating agent selected from silica, alumina, zirconia, polyol and an organic silicon compound.

4. The white heat-curable epoxy resin composition according to claim 1, wherein the triazine derivative epoxy resin of the component (A-1) is 1,3,5-triazine derivative epoxy resin.

5. The white heat-curable epoxy resin composition according to claim 1, wherein the alicyclic epoxy compound of the component (A-1) that has an epoxy group and an alicyclic structure in one molecule and is non-fluid at 25° C., is represented by the following general formula (1):

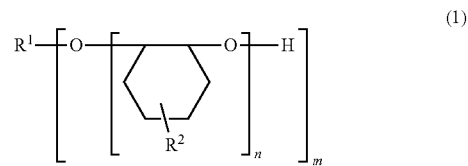

wherein $R^1$ represents an m-valent saturated hydrocarbon group obtained by eliminating m hydrogen atom or atoms from a saturated hydrocarbon having 1 to 30 carbon atoms; m represents an integer of 1 to 30; n represents an integer of 1 to 100; and $R^2$ independently represents a hydrogen atom or a group selected from a saturated hydrocarbon group having 1 to 30 carbon atoms, an unsaturated hydrocarbon group having 2 to 30 carbon atoms, an epoxy group, and a saturated hydrocarbon group having 3 to 30 carbon atoms and an epoxy group, provided that at least one $R^2$ represents an epoxy group or a saturated hydrocarbon group having an epoxy group.

6. An optical semiconductor element case having a cured product of the white heat-curable epoxy resin composition as set forth in claim 1.

7. An optical semiconductor device comprising the optical semiconductor element case as set forth in claim 6.

* * * * *